United States Patent
Izumi et al.

(10) Patent No.: US 8,906,786 B2
(45) Date of Patent: *Dec. 9, 2014

(54) METHOD FOR PRODUCING SINGLE CRYSTAL SIC SUBSTRATE AND SINGLE CRYSTAL SIC SUBSTRATE PRODUCED BY THE SAME

(71) Applicant: Air Water Inc., Sapporo-shi, Hokkaido (JP)

(72) Inventors: Katsutoshi Izumi, Itoh (JP); Takashi Yokoyama, Osaka (JP)

(73) Assignee: Air Water Inc. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/034,894

(22) Filed: Sep. 24, 2013

(65) Prior Publication Data

US 2014/0051235 A1    Feb. 20, 2014

Related U.S. Application Data

(62) Division of application No. 12/742,413, filed on May 11, 2010, now Pat. No. 8,603,901.

(30) Foreign Application Priority Data

Nov. 19, 2007    (JP) .................................. 2007-298752

(51) Int. Cl.
    *H01L 21/265*    (2006.01)
    *C30B 29/36*    (2006.01)
    *C30B 1/10*    (2006.01)
    *H01L 21/02*    (2006.01)
    *H01L 21/762*    (2006.01)

(52) U.S. Cl.
    CPC .............. *H01L 21/265* (2013.01); *C30B 29/36* (2013.01); *C30B 1/10* (2013.01); *H01L 21/02614* (2013.01); *H01L 21/02529* (2013.01); *H01L 21/02381* (2013.01); *H01L 21/02488* (2013.01); *H01L 21/76251* (2013.01)
    USPC .............. 438/478; 438/517; 438/522; 257/77

(58) Field of Classification Search
    USPC .............................. 257/77; 438/541, 522, 517
    See application file for complete search history.

(56) References Cited

U.S. PATENT DOCUMENTS 5,759,908 A  *  6/1998  Steckl et al. ................... 438/479
8,603,901 B2 * 12/2013  Izumi et al. ................... 438/522

* cited by examiner

*Primary Examiner* — Matthew W Such
*Assistant Examiner* — Robert Carpenter
(74) *Attorney, Agent, or Firm* — Wood, Phillips, Katz, Clark & Mortimer

(57) ABSTRACT

A single crystal SiC substrate is produced with low cost in which a polycrystalline SiC substrate with relatively low cost is used as a base material substrate where the single crystal SiC substrate has less strain, good crystallinity and large size. The method including a P-type ion introduction step for implanting P-type ions from a side of a surface Si layer 3 into an SOI substrate 1 in which the surface Si layer 3 and an embedded oxide layer 4 having a predetermined thickness are formed on an Si base material layer 2 to convert the embedded oxide layer 4 into a PSG layer 6 to lower a softening point, and an SiC forming step for heating the SOI substrate 1 having the PSG layer 6 formed therein in an atmosphere hydrocarbon-based gas to convert the surface Si layer 3 into SiC, and thereafter, cooling the resulting substrate to form a single crystal SiC layer 5 on a surface thereof.

9 Claims, 4 Drawing Sheets

METHOD FOR PRODUCING SINGLE CRYSTAL SIC SUBSTRATE AND SINGLE CRYSTAL SIC SUBSTRATE PRODUCED BY THE SAME

TECHNICAL FIELD

The present invention relates to a method for producing a single crystal SiC substrate and the single crystal SiC substrate; specifically relates to a method for producing a single crystal SiC substrate in which a single crystal SiC substrate having a large size, good crystallinity and less strain can be produced, and the single crystal SiC substrate.

RELATED ART

Single crystal SiC (silicon carbide) is excellent in thermal and chemical stability, high in mechanical strength and resistant to irradiation, and due to these properties, has attracted an attention as a semiconductor device material for the next generation. Particularly, the single crystal SiC is considered to be promising in a technical field of substrate material such as a blue light emitting diode, an environmentally-resistant semiconductor device and the like. As a method for obtaining an SiC film used for such an application, there are generally used a liquid phase growth method at a temperature of 1400° C. or more, or a gas-phase growth method at a temperature of 1300° C. or more on a substrate of SiC single crystal.

However, in the above method in which the SiC single crystal is used as starting material, the obtainable SiC single crystal itself is highly expensive and has a small area in fact. Therefore, it is extremely expensive as a semiconductor device as well, thus, strongly demanded is a technique to provide a single crystal SiC substrate having a large area at low cost.

Therefore, as disclosed in Patent Document 1 below, a technique has been provided in which utilizing an insulation-layer-embedded type Si substrate having a surface Si layer as well as an embedded insulation layer ($SiO_2$ layer) and an Si base material layer under the surface Si layer, the surface Si layer of the insulation-layer-embedded type Si substrate is formed into a thin film of around 10 nm, which is subjected to a carbonization process at a high temperature to convert it into a single crystal SiC layer.

Patent Document 1: JP 2003-224248(A)
Patent Document 2: JP 2001-094082(A)

SUMMARY OF THE INVENTION

Problems to be Solved by the Invention

However, in the producing method described above, Si, having a melting point of 1410° C., cannot be subjected at all to the high temperature process at 1400° C. or more, and needs to be subjected to the carbonization process at a temperature at least lower than 1400° C. On the other hand, since coefficients of thermal expansion are different between Si and SiC, and a softening point of $SiO_2$ is relatively high around 1200° C., there have been problems in which a difference of shrinkage ratios occurring between the Si base material layer and the SiC layer in the step of cooling after heating in the carbonization process and the substrate after cooling cannot be prevented from warping. The warp is generated in the substrate itself in this way, thus in fact; there has been a limitation on growing in size of the substrate.

Thus, in the current technique, the single crystal SiC substrate only with high film quality is expensive and of small size is obtained, and a single crystal SiC substrate of a large size and high film quality cannot be obtained in fact. Therefore, a technique to provide the single crystal SiC substrate having a large size and good crystallinity at low cost has been strongly demanded to be developed.

The present invention is made in consideration of the above-described problem, and has an object to provide a method for producing a single crystal SiC substrate in which a polycrystalline SiC substrate with relatively low cost is used as a base material substrate to produce a single crystal SiC substrate having less strain, good crystallinity and large size with low cost, and to provide the single crystal SiC substrate as well.

Means for Solving the Problem

In order to achieve the above object, a method for producing a single crystal SiC substrate according to an aspect of the invention includes a phosphorous ion introduction step for introducing phosphorous ions from a side of a surface Si layer into an SOI substrate in which the surface Si layer and an embedded oxide layer having a predetermined thickness are formed on an Si base material layer to convert the embedded oxide layer into an embedded glass layer to lower a softening point, and an SiC forming step for heating the SOI substrate having the embedded glass layer formed therein in an atmosphere of hydrocarbon-based gas to convert the surface Si layer into SiC, and thereafter, cooling the resulting substrate to form a single crystal SiC layer on a surface thereof.

According to another aspect of the invention, a method for producing a single crystal SiC substrate includes a glass layer forming step for, before joining an Si base material and an Si thin plate constituting a surface Si layer, forming on a surface to be a joint surface thereof, of at least one of the Si base material and the surface Si layer, a glass layer having a softening point lower than at least the $SiO_2$ by a deposition method, a joining step for joining the Si base material and the Si thin plate so as to sandwich the glass layer therebetween to form an embedded type substrate in which the Si base material layer, the surface Si layer and the embedded glass layer are laminated, and an SiC forming step for heating the embedded type substrate in an atmosphere of hydrocarbon-based gas to convert the surface Si layer into SiC, and thereafter, cooling the resulting substrate to form a single crystal SiC layer on a surface thereof.

Further, in order to achieve the above object, a single crystal SiC substrate according to an aspect of the invention includes an Si base material layer, a single crystal SiC layer which is a surface of the Si base material layer, and an embedded glass layer having a softening point lower than at least $SiO_2$ formed between the Si base material layer and the single crystal SiC layer.

Effect of the Invention

That is, the method for producing the single crystal SiC substrate according to a first aspect of the invention includes the carbonization process in which an embedded oxide layer in an SOI substrate is converted into an embedded glass layer having a lower softening point, and thereafter, the resulting substrate is heated in an atmosphere of hydrocarbon-based gas and cooled. Therefore, even if a difference of shrinkage ratios is generated between the SiC layer and the Si base material layer formed in the carbonization process, the embedded glass layer between the SiC layer and the Si base material layer is transformed to generate a slip between the Si base material layer and the SiC layer, greatly suppressing the warp of the entire substrate.

In the method for producing a single crystal SiC substrate according to the first aspect of the invention, if an introduction amount of the phosphorous ions in the phosphorous ion introduction step is from $1\times10^{15}$ to $5\times10^{18}$ ions/cm$^2$, a warp of the substrate can be effectively suppressed with crystallinity of the SiC layer formed being maintained well.

In the method for producing a single crystal SiC substrate according to the first aspect of the invention, the substrate temperature is 200 to 550° C. in the phosphorous ion introduction step, the crystallinity of the surface Si layer is maintained well and a good SiC layer can be ensured in the carbonization step.

In the method for producing a single crystal SiC substrate according to the first aspect of the invention, the phosphorous ion introduction step is performed by ion implantation, and if an accelerating energy of the phosphrous ions at which the time is 5 to 30 keV, the ion implantation can be conducted with the crystallinity of the surface Si layer being maintained. As a result, warp of the substrate can be effectively suppressed.

Further, a method for producing a single crystal SiC substrate according to a second aspect of the invention includes a carbonization process in which the embedded type substrate is formed which has the embedded glass layer lower in the softening point than at least the SiO$_2$ embedded between the Si base material layer and the surface Si layer, and thereafter, the resulting substrate is heated in an atmosphere of hydrocarbon-based gas and cooled. Therefore, even if a difference of shrinkage ratios is generated between the SiC layer and the Si base material layer formed in the carbonization process, the embedded glass layer between the SiC layer and the Si base material layer is transformed to generate a slip between the Si base material layer and the SiC layer, greatly suppressing the warp of the entire substrate.

Moreover, a single crystal SiC substrate according to the invention includes the embedded glass layer lower in the softening point than at least the SiO$_2$ embedded between the Si base material layer and the surface single crystal Si layer. Therefore, even if the carbonization process is performed in which the resulting substrate is heated in an atmosphere of hydrocarbon-based gas and cooled, the embedded glass layer between the SiC layer and the Si base material layer is transformed to generate a slip between the Si base material layer and the SiC layer, greatly suppressing the warp of the entire substrate.

DESCRIPTION OF REFERENCE NUMERALS

Figure 1A:
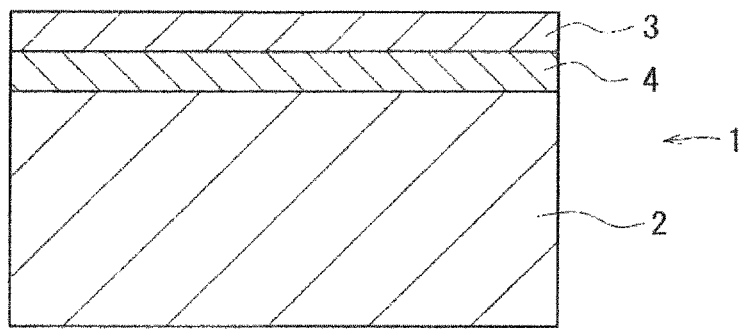
FIGS. 1(A) to 1(C) are views showing a method for producing a single crystal SiC substrate according to a first embodiment of the invention.

1 SOI substrate
2 Si base material layer
3 Surface Si layer
4 Embedded oxide layer, oxide layer
5 Single crystal SiC layer
6 PSG layer
8 GaN layer

BEST MODE FOR CARRYING OUT THE INVENTION

Next, descriptions will be given of the best mode for carrying out the invention.

First Embodiment

FIGS. 1(A) to 1(C) and FIGS. 2(D) to 2(F) are views showing a method for producing a single crystal SiC substrate according to a first embodiment of the invention.

The method for producing the single crystal SiC substrate performs Steps (1) and (2) below.

(1) A phosphorous ion introduction step in which phosphorous ions are introduced from a side of a surface Si layer 3 to an SOI (Silicon On Insulator) substrate 1 in which a surface Si layer 3 and an embedded oxide layer 4 having a predetermined thickness are formed on an Si base material layer 2 to convert the embedded oxide layer 4 into a PSG layer 6 as an embedded glass layer and lower a softening point.

(2) A SiC forming step in which the SOI substrate 1 having the PSG layer 6 as the above-mentioned embedded glass layer formed therein is heated in an atmosphere of hydrocarbon-based gas to convert the surface Si layer 3 into SiC, and thereafter, is cooled to form a single crystal SiC layer 5 on a surface thereof.

FIG. 1(A) shows the SOI substrate 1 in which the surface Si layer 3 and the embedded oxide layer 4 having a predetermined thickness on a surface of the Si base material layer 2. The SOI substrate 1 is configured so that the SiO$_2$ layer having the predetermined thickness as the embedded oxide layer 4 is formed near the surface of the Si base material layer 2, and on a surface thereof formed is the surface Si layer 3 having the predetermined thickness. The thickness of the embedded oxide layer 4 is set to be about 100 to 200 nm.

The surface Si layer 3 of the SOI substrate 1 having a thickness of about 20 nm to 50 nm is made thinner to about 4 nm to 10 nm for use. The thinning process is performed in a manner in which, for example, the SOI substrate 1 is subjected to a heat treatment in an oxidation atmosphere to be oxidized from the surface of the surface Si layer 3 by a predetermined depth for the Si layer having a desired thickness to be remained near an interface with the embedded oxide layer 4, and then, an oxide layer generated on the surface thereof is etched by a hydrofluoric acid or the like to be removed, thinning the surface Si layer 3.

At this time, the thickness, of the thinned surface Si layer 3 is preferably set to be about 4 nm to 10 nm as described above, and more preferably about 4 nm to 7 nm. This is because if the thickness of the thinned surface Si layer 3 is too thin, the single crystal SiC layer 5 will not be generated sufficiently in the subsequent converting step as the carbonization process, and a good single crystal SiC layer 7 cannot be formed.

On the other hand, if the thickness of the thinned surface Si layer 3 is too thick, it is difficult to be completely carbonized when being converted into the single crystal SiC layer 5 in the subsequent carbonization process, and a non-carbonized Si layer will be remained on the bottom end portion of the SiC layer 5. The remained Si layer will easily disperse to an upper portion of the SiC layer by the subsequent heat treatment, resulting to deteriorate the crystallinity thereof. The single crystal SiC layer 5 may be further epitaxial grown as needed; however, if the crystallinity of the single crystal SiC layer 5 as a seed layer is poor; only the single crystal SiC layer 5 with the poor crystallinity is obtained even if the epitaxial growth is performed. In this way, it is very important to perform the complete carbonization so as not to generate the remained SiC layer.

Figure 1B:
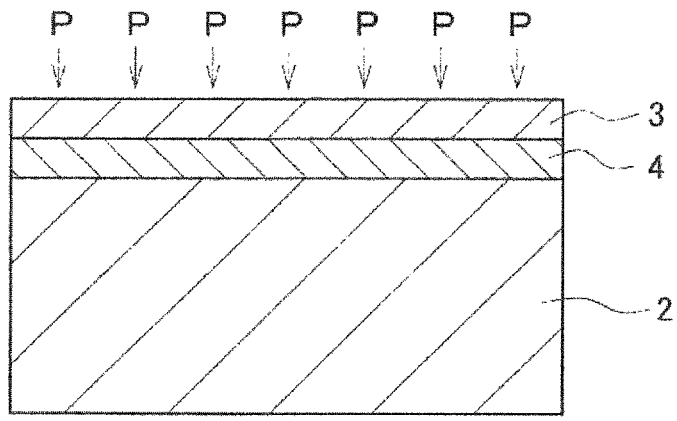
Figure 1C:
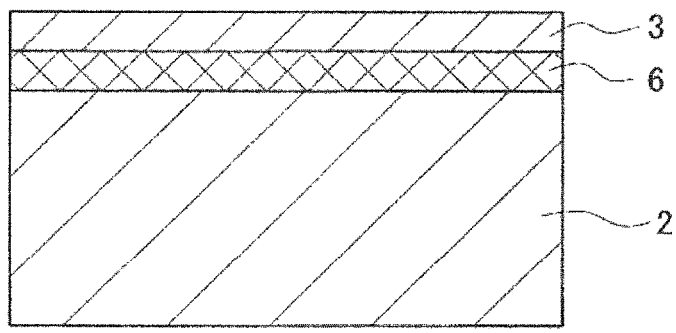

FIG. 1(B) and FIG. 1(C) show the phosphorous ion introduction step in which the phosphorous ions are introduced from the side of the surface Si layer 3 of the SOI substrate 1 to convert the $SiO_2$ constituting the embedded oxide layer 4 into a phosphor-silicate glass (PSG) in which phosphorus is introduced, to form the PSG layer 6 and lower the softening point.

The phosphorous ion introduction step can be performed by, for example, ion implantation and a plasma doping method or the like.

An introduction amount of the phosphorous ions in the phosphorous ion introduction step, that is, a dose amount is preferably $1\times10^{15}$ to $5\times10^{18}$ ions/cm$^2$. This is because an extent of softening of the PSG layer 6 is not sufficient with the dose amount less than $1\times10^{15}$ ions/cm$^2$, and thus, an effect for preventing warp of the substrate cannot be obtained sufficiently. In contrast, if the dose amount exceeds $5\times10^{18}$ ions/cm$^2$, the crystallinity of the surface Si layer 3 is lowered, not obtaining the single crystal SiC layer 5 of good quality and good crystallinity. In this way, the dose amount in the phosphorous ion introduction step is set to $1\times10^{15}$ to $5\times10^{18}$ ions/cm$^2$ to allow to effectively suppress the warp of the substrate while the crystallinity of the single crystal SiC layer 5 to be formed is successfully maintained.

The doping amount of phosphorus for the PSG layer 6 by the ion implantation is preferably set to about 5 to 7 atom %. This is because if the doping amount is less than 5 atom %, the extent of softening of the PSG layer 6 is not sufficient, and an effect for preventing warp of the substrate cannot be obtained sufficiently. In contrast, the doping amount exceeds 7 atom %, hygroscopicity of the PSG layer 6 is raised, and electrical characteristics of an electron device formed using the single crystal SiC layer 5 is seriously deteriorated, not obtaining the electron device of good quality and high reliability. In this way, the doping amount of phosphorus to the glass constituting the PSG layer 6 is set to 5 to 7 atom % to allow to effectively suppress the warp of the substrate while the electrical characteristics of the single crystal SiC layer 5 is successfully maintained.

Moreover, the substrate temperature in the phosphorous ion introduction step is preferably set to 200 to 550° C. If the substrate temperature is less than 200° C., the crystallinity of the surface Si layer 3 is lowered, and the single crystal SiC layer 5 of good quality and good crystallinity cannot be obtained. In contrast, if the substrate temperature exceeds 550° C., Si constituting the surface Si layer 3 begins to sublimate to reduce the thickness, therefore, not obtaining the single crystal SiC layer 5 having enough thickness. In this way, the substrate temperature in the phosphorous ion introduction step is set to 200 to 550° C. to allow successfully maintaining the crystallinity of the single crystal SiC layer 5 and ensure suitable thickness.

If the phosphorous ion introduction step is performed by ion implantation, an accelerating energy of the phosphorous ions at that time is preferably set to 5 to 30 keV. This is because if the accelerating energy is either less than 5 keV or more than 30 keV, the embedded oxide layer 4 cannot be converted into the PSG layer 6 having an enough lower softening point in terms of thickness of the surface Si layer 3. Therefore, the accelerating energy is set to 5 to 30 keV to allow to effectively suppress the warp of the substrate while maintaining the crystallinity of the SiC layer and suitable thickness.

Figure 2D:
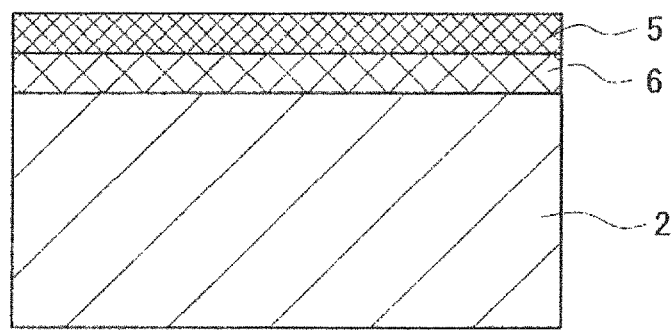
FIGS. 2(D) to 2(F) are views showing the method for producing the single crystal SiC substrate according to the first embodiment of the invention.

FIG. 2(D) shows a state where the SiC forming step is performed in which the SOI substrate 1 having the PSG layer 6 as the embedded glass layer formed therein is heated in an atmosphere of hydrocarbon-based gas to convert the surface Si layer 3 into SiC and then is cooled to form the single crystal SiC layer 5 on the surface thereof.

The SiC forming step can be performed by, for example, changing over the atmosphere gas (hydrogen gas and hydrocarbon gas) introduced in the furnace which can control the atmosphere to adjust the temperature.

With an apparatus as mentioned above, the SOI substrate 1 is placed in the furnace, and a mixture gas of hydrogen gas and hydrocarbon-based gas is supplied into the furnace to raise the temperature of the atmosphere in the furnace to convert the surface Si layer 3 of the SOI substrate 1 into the single crystal SiC layer 5.

At this time, the SOI substrate 1 is placed in the furnace, and the mixture gas in which the hydrocarbon-based gas is mixed to the hydrogen gas at a ratio of 1 vol. % is supplied into the furnace. Further, at the same time as the supply of the mixture gas, the atmosphere temperature in the furnace is heated to 900 to 1405° C. With the heating, the surface Si layer 3 of the SOI substrate 1 can be converted into the single crystal SiC layer 5.

Here, the hydrogen gas is a carrier gas, and as the hydrocarbon gas a propane gas is used, for example. For example, if the supply amount from a canister of hydrogen gas is 1000 cc/min, the supply amount from a canister of hydrocarbon gas is 10 cc/min.

Then, the substrate is heated for a predetermined time, and cooled to a room temperature after the surface Si layer 3 is completely carbonized to be converted into the single crystal SiC layer 5. At this time, the PSG layer 6 having a softening point lower than $SiO_2$ exists between the single crystal SiC layer 5 and the Si base material layer 2, therefore, even if a difference of shrinkage ratios is generated between the single crystal SiC layer 5 and the Si base material layer 2, which are formed in the carbonization process, the PSG layer 6 between the single crystal SiC layer 5 and the Si base material layer 2 is deformed to generate a slip between the Si base material layer 2 and the single crystal SiC layer 5, enabling to greatly suppress the warp of the entire substrate.

Figure 2E:
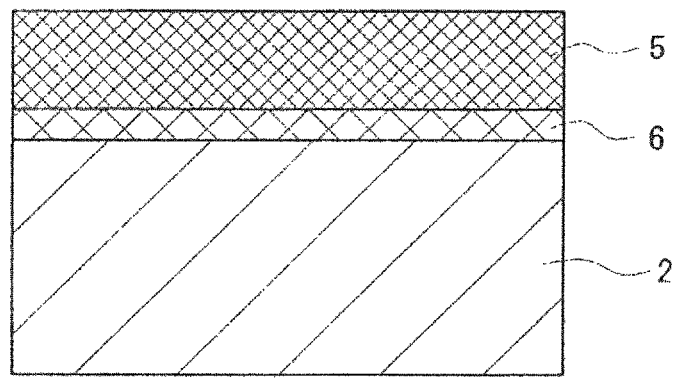

FIG. 2(E) shows a state where the single crystal SiC layer 5 formed as described above is used as the seed layer, and the single crystal SiC layer 5 is further grown epitaxially.

The epitaxial growth is performed, for example, with the following conditions to epitaxially grow the single crystal SiC layer 5. For example, a substrate having the single crystal SiC layer 5 on the surface thereof is placed inside a processing chamber, and treated at a temperature of 900 to 1405° C. while a material gas of methylsilane-based gas such as monomethylsilane is supplied into the processing chamber at a gas flow rate of about 1.0 sccm. Thus, by epitaxially growing using the single crystal SiC layer 5 as a seed layer, the single crystal SiC layer 5 can be grown.

In this way, in heating and cooling in epitaxially growing the single crystal SiC layer 5, the PSG layer 6 with a low softening point exists between the single crystal SiC layer 5 and the Si base material layer 2; therefore, the PSG layer 6 between the single crystal SiC layer 5 and the Si base material layer 2 is deformed to generate a slip between the Si base material layer 2 and the single crystal SiC layer 5, enabling to greatly suppress the warp of the entire substrate.

The processing temperature above (the process can be performed within the above temperature range) is preferably set to about 1000 to 1350° C. in order to obtain a film with better quality and in view of facility cost, energy cost, maintenance cost and the like.

Alternatively, the epitaxial growth can be performed by simultaneously supplying silane-based gas such as monosilane gas and hydrocarbon-based gas such as propane gas into the processing chamber to process in the above temperature range, thus, the single crystal SiC layer 5 epitaxially grows.

In this way, the single crystal SiC substrate according to the invention can be obtained in which the PSG layer 6 as the embedded glass layer having the softening point lower than at least $SiO_2$ is formed between the Si base material layer 2 and the surface single crystal SiC layer 5.

Figure 2F:
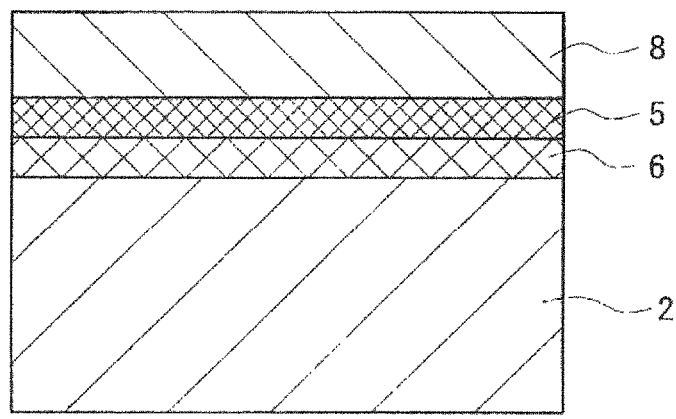

FIG. 2(F) shows a state where another semiconductor film such as a GaN layer 8 is formed by the epitaxial growth on the single crystal SiC layer 5 as needed.

The epitaxial growth is performed with, for example, the conditions below to grow the GaN layer 8. For example, a substrate having the single crystal SiC layer 5 formed therein is placed in the processing chamber, and is processed at a temperature of 950 to 1200° C., while triethylgallium at a flow rate of about 2 sccm and ammonia at a flow rate of about 1250 sccm are supplied into the processing chamber; thus, the GaN layer 8 can be formed on the single crystal SiC layer 5.

In this way, in heating and cooling in epitaxially growing the GaN layer 8 on the single crystal SiC layer 5, the PSG layer 6 with a low softening point exists between the single crystal SiC layer 5 and the Si base material layer 2; therefore, the PSG layer 6 between the single crystal SiC layer 5 and the Si base material layer 2 is deformed to generate a slip between the Si base material layer 2 and the single crystal SiC layer 5, enabling to greatly suppress the warp of the entire substrate.

Figure 3:
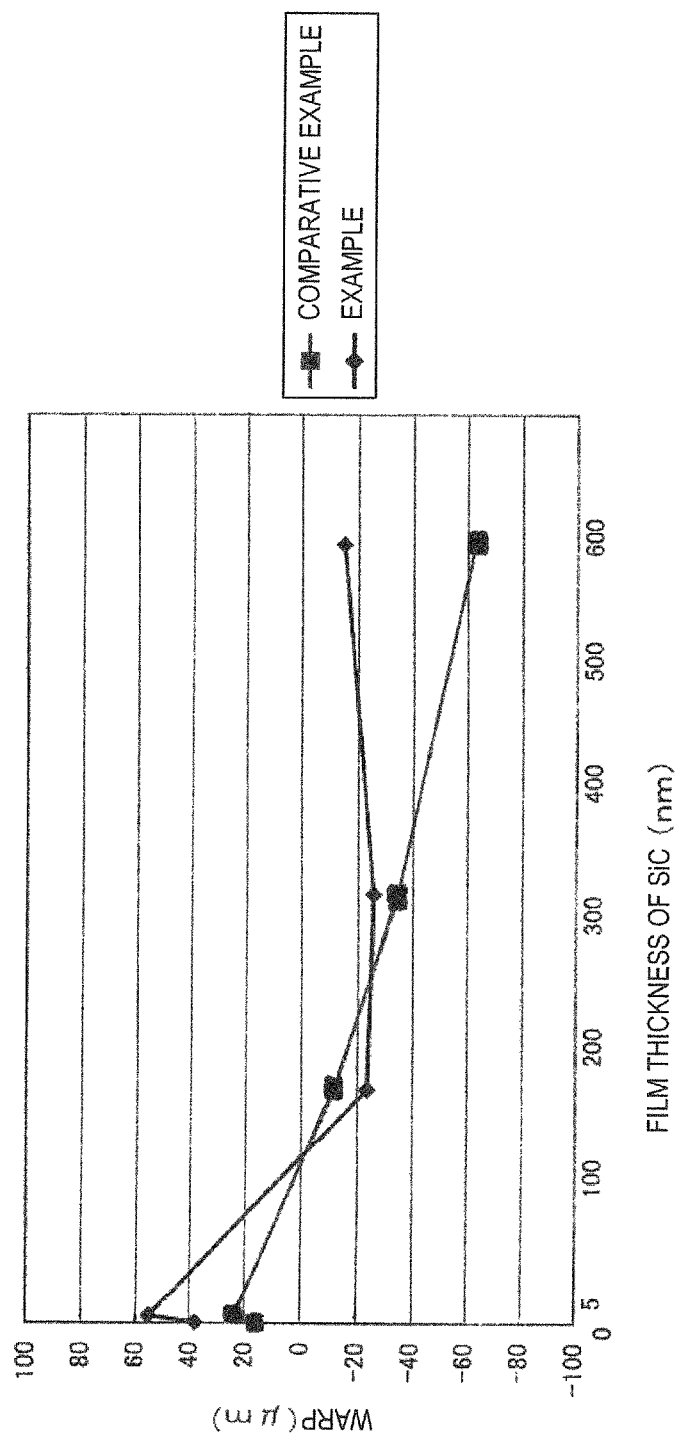
FIG. 3 is a view showing the method for producing the single crystal SiC substrate.

FIG. 3 shows results of measuring an amount of warp of the substrates of an example of the invention and a comparative example.

The SOI substrate 1 was prepared where the surface Si layer 3 having a thickness of 7 nm, the Si base material layer 2 having a thickness of 725 μm, the embedded oxide layer 4 having a thickness of 160 nm, and a diameter of the substrate is 200 mm.

In the example, the phosphorous ions were implanted to the SOI substrate 1 to convert the embedded oxide layer 4 into the PSG layer 6, and then, the carbonization process was preformed. The accelerating energy of the ions was set to 30 keV, the dose amount was set to $6 \times 10^{15}$ ions/cm$^2$, and the substrate temperature was set to 250° C. In the comparative example the carbonization process was performed without performing implanting of the SOI substrate 1 with the ions.

The carbonization process was performed while the mixture gas was flowed at a ratio of the propane gas of 30 cc and the hydrogen gas of 2000 cc, and the substrate was heated at 1250° C. for 15 minutes.

In the subsequent epitaxial growth, the process was performed at a temperature of 1200° C. while the monomethylsilane gas was supplied at a gas flow rate of about 3 sccm, and the processing period of time was varied to prepare samples having a final thicknesses of the single crystal SiC layers 5 at 5 nm, 160 nm, 320 nm, and 600 nm.

The warp amount was measured as follows. That is, a sample to be measured having a diameter of 200 mm was placed on a sample measuring pedestal having a horizontal reference plane, and scanned in a horizontal plane with the surface of the aforementioned sample to be measured being contact with a probe of a warp amount probe measurement. At this time, a waviness which appeared in the horizontal plane in response to a waviness on the surface of the sample to be measured was recorded, and the waviness is measured by determining as the warp amount of the entire substrate.

As seen from FIG. 3, when the thickness of the single crystal SiC layer 5 exceeds 300 nm, the example obtained good results. Note that the comparative example seems to be better with regards to the portion having a thinner thickness, however this difference is within the scope of measurement error, and the suppressing effect of warp notably appears from around a portion where the thickness exceeds 300 nm.

Note that in the above example, a case is shown where only the phosphorous ions were introduced in the ion implantation to convert the embedded oxide layer 4 into the PSG layer 6; however, B-type ions may additionally be introduced with the phosphorous ions to convert the embedded oxide layer 4 into the BPSG layer.

Second Embodiment

FIGS. 4(A) to 4(D) are diagrams showing a method for producing a single crystal SiC substrate according to a second embodiment of the invention.

The method for producing the single crystal SiC substrate performs Steps (1), (2) and (3) below.

(1) A glass layer forming step of, before joining an Si base material and an Si thin plate constituting a surface Si layer, forming on a surface, to be a joint surface thereof, of at least one of the Si base material and the surface Si layer by a deposition method a glass layer having a softening point lower than at least the $SiO_2$.

(2) A joining step of joining the Si base material and the Si thin plate so as to sandwich the glass layer therebetween to form an embedded type substrate in which the Si base material layer, the surface Si layer and the embedded glass layer are laminated.

(3) An SiC forming step of heating the embedded type substrate in an atmosphere of hydrocarbon-based gas to convert the surface Si layer into SiC, and thereafter, cooling the resulting substrate to form a single crystal SiC layer on a surface thereof.

Figure 4A:
FIGS. 4(A) to 4(D) are views showing a method for producing a single crystal SiC substrate according to a second embodiment of the invention.

As shown in FIG. 4(A), in this example, firstly, over the surface of the Si thin plate constituting the surface Si layer 3, a PSG layer 6 is formed by a deposition method, which is a glass layer having a softening point lower than at least the $SiO_2$.

The deposition method may be applied with various deposition methods, for example, a chemical gas-phase deposition method such as a decompression CVD and a plasma CVD, and a physical gas-phase deposition method such as a vacuum deposition method, a sputtering method and the like.

Figure 4B:
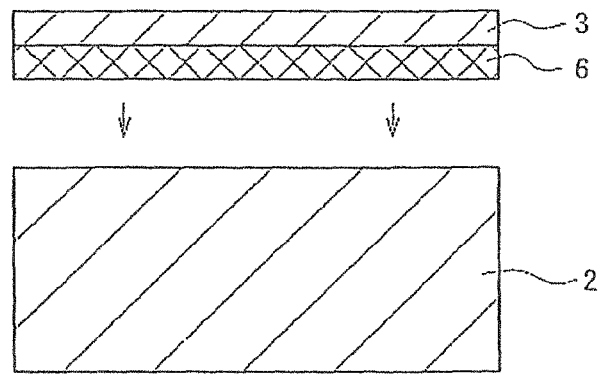

As shown in FIG. 4(B), the surface Si layer 3 having formed the PSG layer 6 thereon and the Si base material layer 2 are joined to each other so as to interpose the PSG layer 6 therebetween. The PSG layer 6 is a glass doped with phosphorus, and the doping amount of phosphorus is preferably set to about 5 to 7 atom %. This is because if the doping amount is less than 5 atom %, the extent of softening of the PSG layer 6 is not sufficient, and thus, an effect for preventing a warp of the substrate cannot be obtained enough. In contrast, if the doping amount exceeds 7 atom %, hygroscopicity of the PSG layer 6 is raised, and electrical characteristics of an electron device formed using the single crystal SiC layer 5 is seriously deteriorated, not obtaining the electron device of good quality and high reliability. In this way, the doping amount of phosphorus to the glass constituting the PSG layer 6 is set to 5 to 7 atom % to allow to effectively suppress the warp of the substrate while the electrical characteristics of the single crystal SiC layer 5 formed is successfully maintained.

The joining can be performed by laminating the surface Si layer 3 and the PSG layer 6 on an upper surface of the Si base material layer 2 so that the surface Si layer 3 is oriented upwardly and the PSG layer 6 is oriented downwardly, and heating the resulting substrate. The heating temperature at this time is about 850 to 950° C., and the heating time is about 30 to 60 minutes.

Figure 4C:
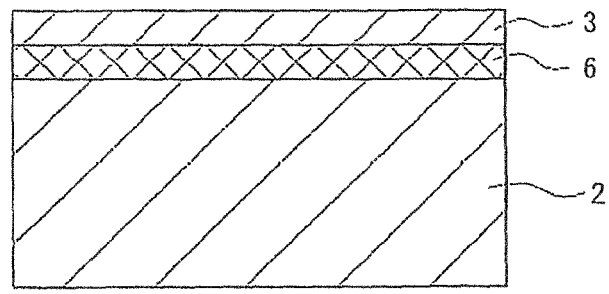

FIG. 4(C) shows the embedded type substrate in which the embedded type PSG layer 6 is laminated between the Si base material layer 2 and the surface Si layer 3 both formed as the above. In the embedded type substrate, the thickness of the PSG layer 6 is set to about 100 to 200 nm, and the surface Si layer 3 is thinned to a thickness of 4 nm to 10 nm in advance, similar to the first embodiment described above.

Next, the embedded type substrate is heated in an atmosphere of hydrocarbon-based gas to convert the surface Si layer 3 into SiC, and then cooled to form the single crystal SiC layer 5 on the surface. The conditions of the carbonization process are similar to those of the first embodiment described above.

Figure 4D:
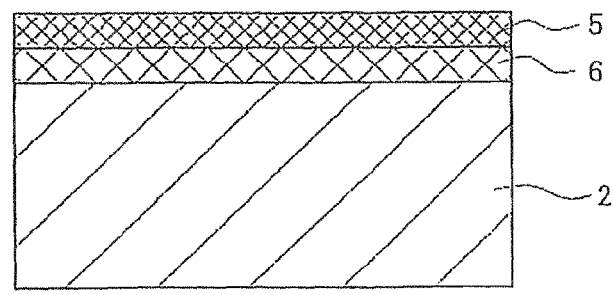

FIG. 4(D) shows the embedded type substrate in which the embedded type PSG layer 6 is laminated between the Si base material layer 2 and the surface Si layer 3 both formed as the above.

Thereafter, the single crystal SiC layer 5 is grown epitaxially and another semiconductor layer such as the GaN layer 8 is laminated. The conditions of the epitaxial growth are the same as those of the first embodiment described above.

In this way, the single crystal SiC substrate according to the invention can be obtained in which the PSG layer 6 as an embedded glass layer having a softening point lower than at least $SiO_2$ is formed between the Si base material layer 2 and the surface single crystal SiC layer 5.

Note that, in this example, the PSG layer 6 is formed over the surface of the Si thin plate constituting the surface Si layer 3, and then is joined to the Si base material layer 2. However, the PSG layer 6 is formed over the surface of the Si base material layer 2 and then the Si thin plate constituting the surface Si layer 3 may be joined, or the PSG layer 6 may be formed over the surfaces of both the Si base material layer 2 and the Si thin plate constituting the surface Si layer 3, and then, both layers may be joined.

In the method for producing the single crystal SiC substrate according to this embodiment, the embedded type substrate in which the PSG layer 6 having the softening point lower than at least $SiO_2$ is formed between the Si base material layer 2 and the surface Si layer 3 is formed, and thereafter, the carbonization process of heating the substrate in the atmosphere of hydrocarbon-based gas and cooling the substrate is performed. Therefore, even if a difference of shrinkage ratios is generated between the single crystal SiC layer 5 and the Si base material layer 2 formed in the carbonization process, the PSG layer 6 between the single crystal SiC layer 5 and the Si base material layer 2 is deformed to generate a slip between the Si base material layer 2 and the SiC layer 5, greatly suppressing the warp of the entire substrate.

Note that the embodiment described above shows a case where the PSG layer 6 is formed by the deposition method; however, a BPSG layer (boron phosphorus silicon glass layer) may be formed similarly by the deposition method.

INDUSTRIAL APPLICABILITY

The invention can be applied to production and the like of a semiconductor substrate to be used for a large-scale integrated circuit and the like.

What is claimed is:

1. A method for producing a GaN substrate, comprising:
a phosphorus ion introduction step for introducing phosphorus ions from a side of a surface Si layer into an SOI substrate in which the surface Si layer and an embedded oxide layer having a predetermined thickness are formed on an Si base material layer to convert the embedded oxide layer into an embedded glass layer to lower a softening point; and
an SiC forming step for heating the SOI substrate having the embedded glass layer formed therein in an atmosphere of hydrocarbon-based gas to convert the surface Si layer into SiC, and thereafter, cooling the resulting substrate to form a single crystal SiC layer on a surface thereof,
wherein the SiC forming step further comprises causing the embedded glass layer between the SiC layer and the Si base material layer to be transformed to cause slippage between the Si base material layer and the SiC layer, to accommodate a difference in shrinkage ratios between the SiC layer and the Si base material layer during performance of the method,
heating and cooling to epitaxially grow the GaN layer on the single crystal SiC layer, and thereby causing the embedded glass layer between the SiC layer and the Si base material layer to be transformed to cause slippage between the Si base material layer and the SiC layer, to suppress warp of the entire SOI substrate with the formed single crystal SiC layer.

2. The method for producing the GaN substrate according to claim 1, wherein an introduction amount of the phosphorus ions in the phosphorus ion introduction step is $1 \times 10^{15}$ to $5 \times 10^{18}$ ions/cm$^2$.

3. The method for producing the GaN substrate according to claim 2, wherein a temperature of the substrate in the phosphorus ion introduction step is from 200-550° C.

4. The method for producing the GaN substrate according to claim 3 wherein the phosphorus ion introduction step is conducted by ion implantation where accelerating energy of the phosphorus ions is 5 to 30 keV.

5. The method for producing the GaN substrate according to claim 2 wherein the phosphorus ion introduction step is conducted by ion implantation where accelerating energy of the phosphorus ions is 5 to 30 keV.

6. The method for producing the GaN substrate according to claim 1, wherein a temperature of the substrate in the phosphorus ion introduction step is from 200°-550° C.

7. The method for producing the GaN substrate according to claim 6 wherein the phosphorus ion introduction step is conducted by ion implantation where accelerating energy of the phosphorus ions is 5 to 30 keV.

8. The method for producing the GaN substrate according to claim 1 wherein the phosphorus ion introduction step is conducted by ion implantation where accelerating energy of the phosphorus ions is 5 to 30 keV.

9. A method for producing a GaN substrate, comprising:
a glass layer forming step for, before joining an Si base material and an Si thin plate constituting a surface Si layer, forming on a surface to be a joint surface thereof, of at least one of the Si base material and the surface Si layer, a glass layer having a softening point lower than at least the $SiO_2$ by a deposition method;
a joining step for joining the Si base material and the Si thin plate so as to sandwich the glass layer therebetween to form an embedded type substrate in which the Si base material layer, the surface Si layer and the embedded glass layer are laminated; and an SiC forming step for heating the embedded type substrate in an atmosphere of hydrocarbon-based gas to convert the surface Si layer into SiC, and thereafter, cooling the resulting substrate to form a single crystal SiC layer on a surface thereof, wherein the SiC forming step further comprises causing the embedded glass layer between the SiC layer and the Si base material layer to be transformed to cause slippage between the Si base material layer and the SiC layer, to accommodate a difference in shrinkage ratios between the SiC layer and the Si base material layer during performance of the method, heating and cooling to epitaxially grow the GaN layer on the single crystal SiC layer, and thereby causing the embedded glass layer between the SiC layer and the Si base material layer to be transformed to cause slippage between the Si base material layer and the SiC layer, to suppress warp of the entire single crystal SiC layer.

* * * * *